United States Patent [19]
Jones et al.

[11] Patent Number: 5,978,727
[45] Date of Patent: Nov. 2, 1999

[54] METHOD AND APPARATUS FOR ENGINE ANALYSIS BY WAVEFORM COMPARISON

[75] Inventors: Barbara L. Jones, King's Lynn; Kenneth W. Peter, Ely; Paul Smith, Thethford, all of United Kingdom

[73] Assignee: Sun Electric U.K. Limited, King's Lynn, United Kingdom

[21] Appl. No.: 08/616,684

[22] Filed: Mar. 15, 1996

[30] Foreign Application Priority Data

Mar. 18, 1995 [GB] United Kingdom ............ 9505540

[51] Int. Cl.$^6$ .............. F02P 17/00; G01M 15/00
[52] U.S. Cl. .............. 701/101; 701/102; 701/115; 73/117.3
[58] Field of Search .............. 701/101, 102, 701/111, 115, 114; 73/35.03, 35.04, 116, 117.3

[56] References Cited

U.S. PATENT DOCUMENTS

| | | | |
|---|---|---|---|
| 3,286,164 | 11/1966 | DeHuff | 361/179 |
| 4,215,404 | 7/1980 | Bukhtiyarov et al. | 701/102 |
| 4,394,742 | 7/1983 | Crummer et al. | 701/102 |
| 4,424,709 | 1/1984 | Meier, Jr. et al. | 73/117.3 |
| 4,800,507 | 1/1989 | Brown | 702/73 |
| 4,807,147 | 2/1989 | Halbert et al. | 702/66 |
| 4,812,979 | 3/1989 | Hermann et al. | 73/117.3 |
| 4,928,105 | 5/1990 | Langner | 342/192 |
| 5,041,976 | 8/1991 | Marko et al. | 701/102 |
| 5,063,515 | 11/1991 | Kunst | 701/101 |
| 5,066,909 | 11/1991 | Firooz | 324/158.1 |
| 5,081,592 | 1/1992 | Jenq | 702/68 |
| 5,088,044 | 2/1992 | Matsuura | 123/406.35 |
| 5,119,315 | 6/1992 | Kemp et al. | 702/27 |
| 5,153,501 | 10/1992 | Shimada et al. | 324/121 R |
| 5,194,813 | 3/1993 | Hannah et al. | 73/117.3 |
| 5,222,028 | 6/1993 | LaBarre et al. | 702/73 |
| 5,334,938 | 8/1994 | Kugler et al. | 701/111 |
| 5,387,870 | 2/1995 | Knapp et al. | 701/102 |
| 5,436,847 | 7/1995 | Schroer et al. | 702/76 |
| 5,663,493 | 9/1997 | Gerbert et al. | 73/116 |

FOREIGN PATENT DOCUMENTS

| | | |
|---|---|---|
| 4239096 | 5/1994 | Germany . |
| 2135061 | 8/1984 | United Kingdom . |
| 2246110 | 3/1992 | United Kingdom . |

Primary Examiner—Willis R. Wolfe
Assistant Examiner—Hieu T. Vo
Attorney, Agent, or Firm—Emrich & Dithmar

[57] ABSTRACT

A method and apparatus for analysis of engines analyzes digitized input signals from, for example, engine injectors and compares this digital data with the corresponding values of a digitized template or comparison signal. Compliance or divergence between the digitized signal values is indicated in bar graph form.

27 Claims, 5 Drawing Sheets

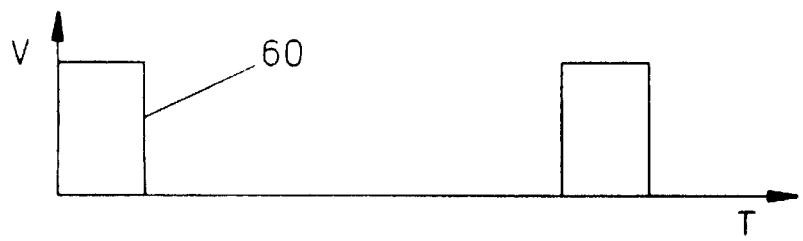
FIG. 14
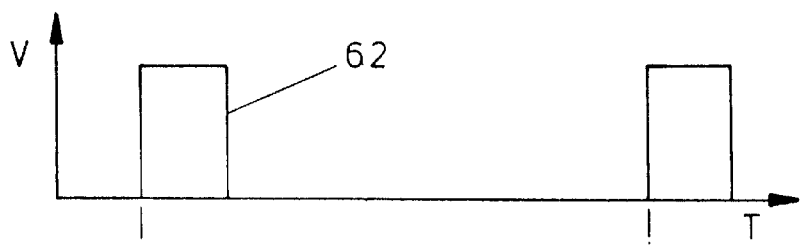
FIG. 15
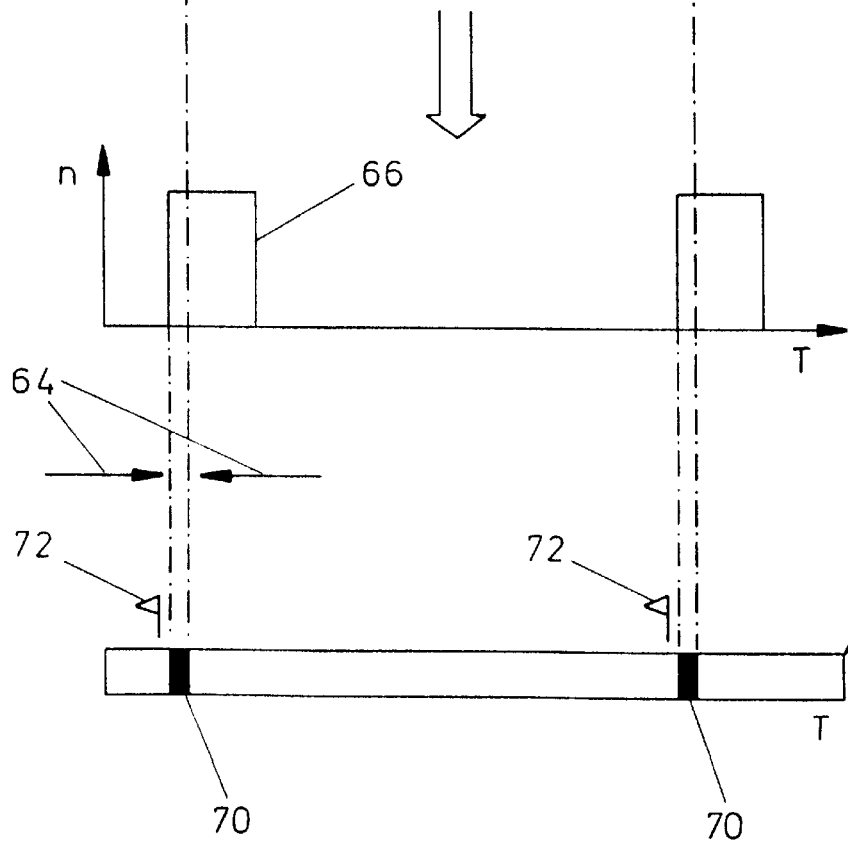
FIG. 16
FIG. 17

METHOD AND APPARATUS FOR ENGINE ANALYSIS BY WAVEFORM COMPARISON

BACKGROUND OF THE INVENTION

1. Field of the Invention

This invention relates to a method and apparatus for engine analysis applicable to the electrodynamic analysis of electronic signals derived from an engine. An example of the application of the invention is to the analysis of the operation of a spark-ignition internal combustion engine by analysis of electrical signals derived from the spark ignition system. However, the invention is applicable to the analysis of compression ignition engines. Indeed, certain broad aspects of the invention are applicable to the analysis of signals relating to the operation of any rotary equipment, whereby the operation of the equipment can be analyzed, particularly by reference to and by comparison with expected operating parameters, such as corresponding signals relating to the engine or other equipment when operating in a substantially new condition. In this way, a measure can be obtained of the degree of divergence of the equipment from its ideal operating condition as a result of use and wear etc.

An example of an input signal which may be analyzed in accordance with the principles of the present invention is an electrical wave form derived from the spark ignition system of an internal combustion engine. Examples of other input signals and waveforms to which the present invention is applicable are electronic control unit signals, and relay switching (distributor-type ignition systems) signals. These are examples of time-based signals for analysis. In addition, as examples of signals in which analysis would be performed on a frequency basis are signals derived from vibration diagnostic equipment, such as the apparatus disclosed in our co-pending and unpublished application GB 9501380.1 (P52555GB); and oscillator outputs relating to frequency based gas sensing (such as may arise from sensing gas pressures in the crankcase or exhaust system of an automotive or other engine), or shaft encoder outputs for rotating machinery in which, for example, the encoder output frequency is dependent upon the rotational velocity of the shaft. As an example of signals where the basis of comparison is amplitude, there are power supply ripple voltages, such as might be obtained from the alternator of an automotive vehicle, and the battery charging current of such a vehicle.

2. Description of Prior Art

Conventionally, an input wave form from the spark ignition system of an internal combustion engine has been analyzed by visual techniques including the use of a suitable display on a cathode ray tube, whether in analog form for instantaneous visual analysis by a trained technician, or by digital analysis, digital recording, and subsequent simulated analog display of digitized data, in accordance with the teachings in European patent EP 08 13 53B (Bear).

The digital analysis, recording and subsequent display in simulated analog form of the above-mentioned prior patent provide the advantages of flexibility of processing of the data prior to visual display, but is inherently subject to the shortcomings of visual assessment techniques, namely the limitations of any visual assessment technique, these relating to the observer's own personal visual assessment capabilities, which vary from person to person. Moreover, such an assessment is inevitably somewhat superficial and lacks the attention to detail which would clearly be beneficial if the remedial steps to be taken following such an assessment are to be carried out with the level of precision which can be realized when modern servicing techniques are utilized to their fullest extent.

There is disclosed in U.S. Pat. No. 5,387,870 (Knapp et al.) a method and apparatus for feature extraction from internal combustion engine ignition waveforms. In this apparatus a processor means determines in real time, times corresponding to positions along an ignition wave form corresponding to firing time, beginning of dwell interval, next firing time etc, and real time values corresponding to firing peak height, firing line duration etc. These values are compared with fixed threshold values so that anomalies can be determined. No comparison is provided between the input signal and a corresponding comparison or template signal. This disclosure corresponds in its main substantive elements with the functions provided by presently available automotive test equipment in which an input waveform is compared with pre-stored data representative of the limit values (or threshold values) of the relevant waveform. However, no means is provided enabling a convenient and effective comparison of the actual input waveform with the appropriate form of that wave in its ideal condition or format.

U.S. Pat. No. 5,119,315 discloses a method of correlating an input mass chromatogram with reference chromatogram data.

The prior art appears to contain no disclosure of a process whereby convenient comparison between an input signal from an actual operating machine can be analyzed by reference to the corresponding waveform as produced by its ideal counterpart, for example the machine in new form.

SUMMARY OF THE INVENTION

According to the invention there is provided a method of analysis of engines and/or other rotary machines, and corresponding apparatus as set forth in the accompanying claims, and a corresponding apparatus for analysis of engines and/or other rotary machines as likewise defined therein.

In accordance with the teachings of the present invention we have taken the step forward of providing a method and apparatus which, in its embodiments, is capable of overcoming the above-identified shortcomings, this being achieved by eliminating the step of providing (as disclosed in the above-discussed EP specification) an analog visual representation of the incoming signal, and substituting for this an electronic comparison step, which can be carried out on the digitized data which has hitherto been used as a basis for producing an analog visual signal representation, such as a waveform.

Thus, in accordance with the teachings of the present invention, an incoming signal is subjected to an initial digitizing process. Then, the digitized data is subjected to an analytical step in which it is compared with data representing the basis for comparison, such as the wave form of the relevant signal produced by the equipment in its ideal form, such as the new equipment. Thus, the digitized data can be compared, item by item with the ideal data so as to produce an extremely detailed analytical result, enabling a far more refined comparison basis to be established than in the case of the above-discussed prior U.S. patents in which signal values are merely compared with threshold values.

We have realized that, in the case of such a step-by-step analysis process, the result which is required may well need only to be in the form of a yes/no answer, since the comparison with the standard or "template" waveform in itself obviates visual inspection of the input waveform.

Accordingly, the result of this analytical step may, in accordance with another aspect of the present invention, be displayed or otherwise indicated in a variety of forms indicative, at a minimum, merely of whether or not compliance with the predetermined standard or template is achieved, and in some cases there may be provided in addition an indication applicable to the situation of non-compliance, of the degree of non-compliance, and possibly other characteristics of non-compliance. Such data can be indicated in a variety of visual or even audible ways.

Thus, in accordance with a broad aspect of the invention, there is provided a method and apparatus in which incoming test data is initially digitized. Then, some at least of the digitized data is compared with a standard. The result of the comparison step is then used to generate an indication of compliance.

The digitized data may of course be recorded and, after such recordal the comparison step may be carried out at any convenient time.

Likewise, the digitized data may be subjected to one or more data processing steps, for example in a computer system associated with the test apparatus, or remote therefrom, prior to or simultaneously with the analytical comparison step.

Embodiments of the invention provide the significant advantages of simplifying engine analysis, and thus correspondingly reducing the time taken and increasing the ease with which it is carried out. The person carrying out the test merely selects the appropriate template wave form, connects the engine to the test equipment to provide the input wave form for comparison purposes. The equipment then produces an appropriate indication of compliance or not.

BRIEF DESCRIPTION OF THE DRAWINGS

Embodiments of the invention will now be described by way of example with reference to the accompanying drawings in which:

FIGS. 8 to 10, 11 to 13 and 14 to 17 show three groups of respective template and input wave forms together with the corresponding bar graphs showing the output of the comparison function.

DESCRIPTION OF THE PREFERRED EMBODIMENT

Figure 4:
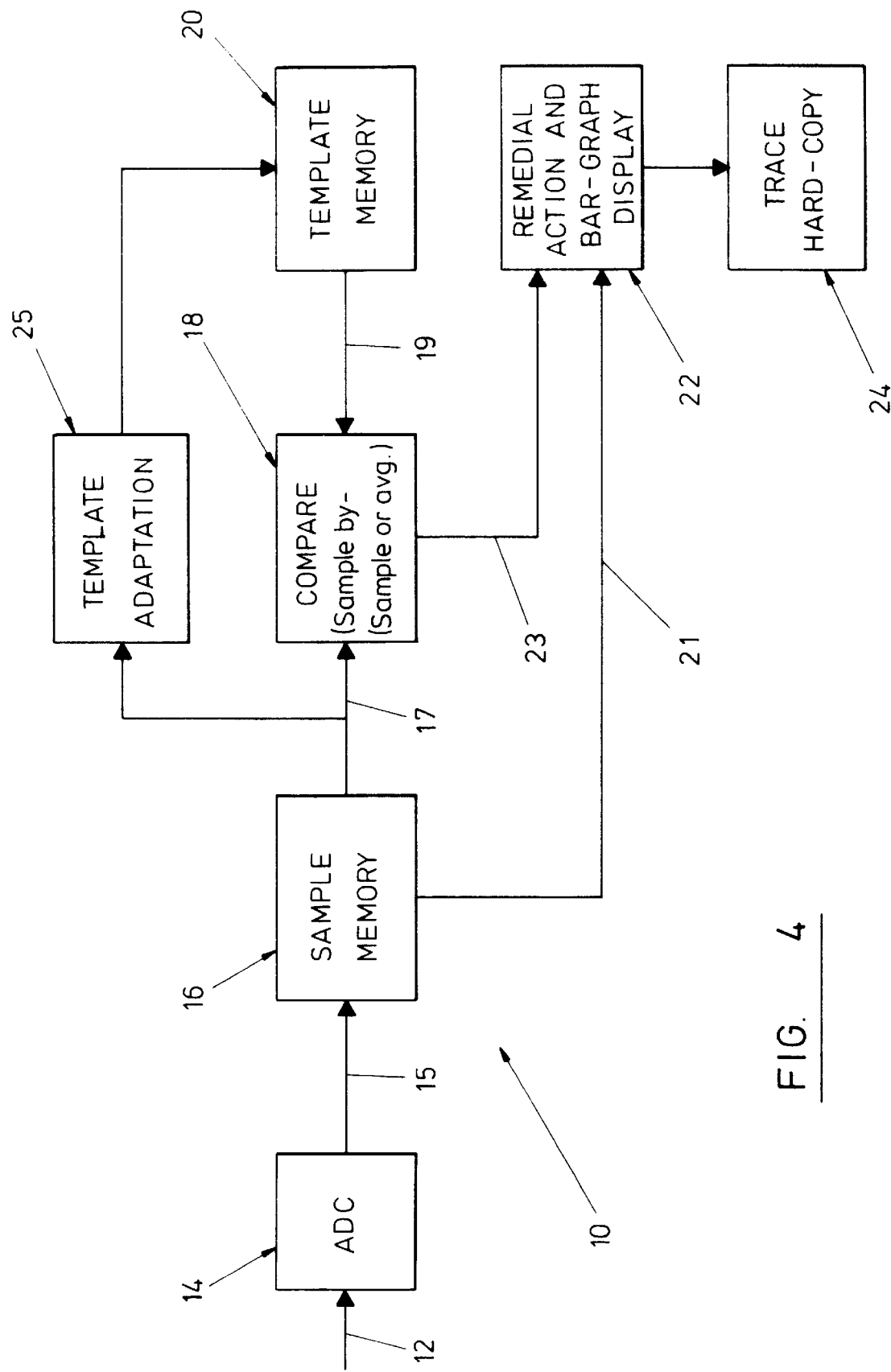
FIG. 4 shows, in functional block diagram form, circuits forming an embodiment of the invention and providing for analog-to-digital input signal conversion, comparison of the digitized signal with a "template" signal and display of the result of the comparison, for example in bar-graph form.

The apparatus of FIG. 4 is adapted to receive electronic input signals from a variety of sources, such as any suitable voltage or current pick up system capable of picking up voltage or current providing an indication of the operating function of any operating system of an automotive vehicle, for example the ignition system.

Figure 1:
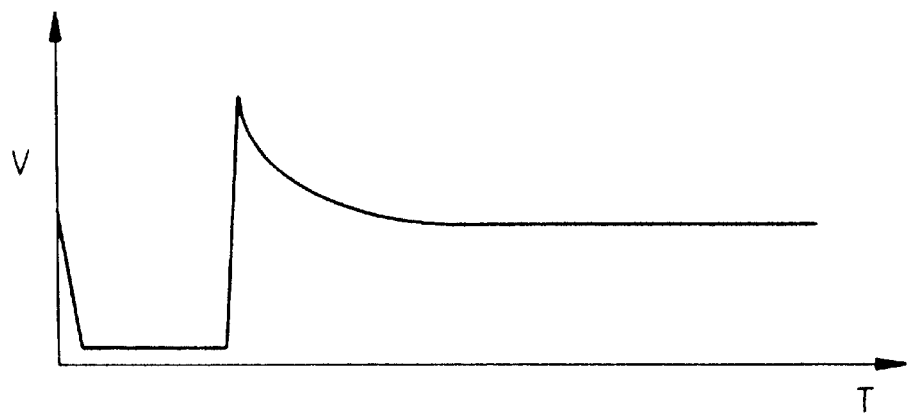
FIG. 1 shows a conceptual representation of a typical input waveform for the purposes of the present invention, based upon injector operation for a (compression)/spark-ignition engine, the plot of injector valve voltage against time being in conventional analog form.
Figure 2:
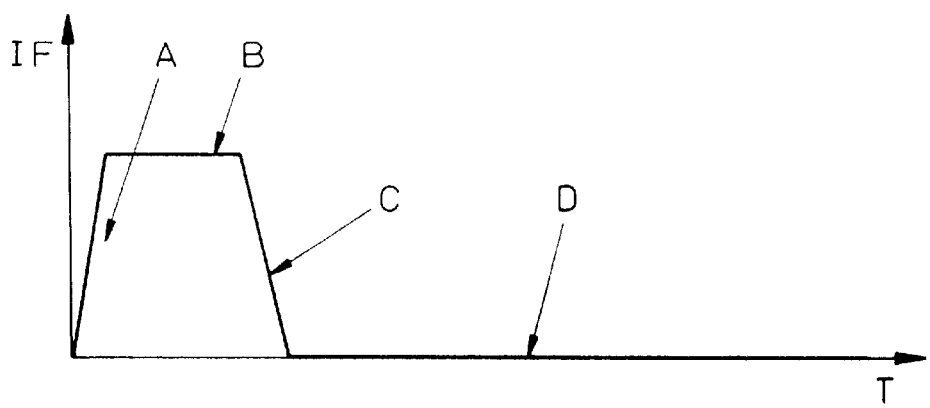
FIG. 2 shows the injector operation of FIG. 1 represented likewise conventionally in analog form but with the voltage dip indicated in terms of actual injector opening (A), held-open (B), closing (C), and held-closed (D) movements, the functions plotted being injector function (IF) or opening against time (T)
Figure 3:
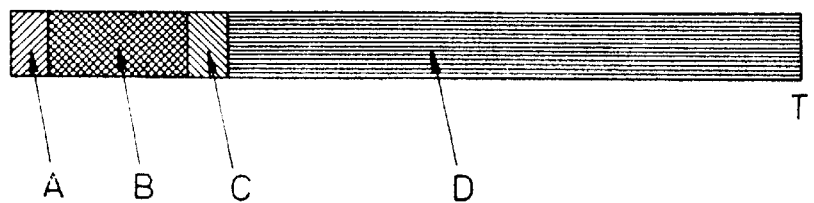
FIG. 3 shows a corresponding bar graph representation of the injector functions plotted in FIG. 2, these being indicated in bar form as produced, for example, by the "bar-graph display" and "trace hard-copy" functions of the apparatus of FIG. 4.
Figure 5:
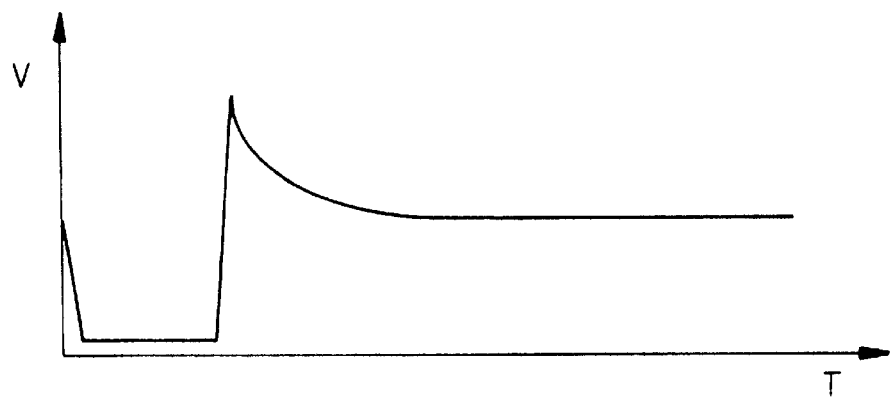
FIGS. 5 and 6 show in vertically aligned relationship the injector function plot of FIG. 1, with FIG. 5 showing a "template" held in the template memory for use in the apparatus of FIG. 4, and, positioned below it in FIG. 6, a typical sample input signal in analog form and corresponding to the injector operations of FIG. 5, but with an indication (at 26) of an injector fault to be identified by the apparatus of FIG. 4.

Thus, the voltage input signal for the apparatus 10 of FIG. 4 can be represented by the voltage input signal shown in FIGS. 1 and 5. In these examples, for the particular injector function concerned, the voltage input signals, as shown in analog form, are in what may be termed "ideal" form, i.e. not including any fault suitable for identification by the apparatus of FIG. 4. Of course, the presence or otherwise of "a fault" depends entirely on the basis for comparison.

Apparatus 10 comprises input signal connection means 12 coupled to an analog-to-digital converter (ADC) 14, which is coupled to a sample memory function circuit 16. Further functional portions of the apparatus 10 comprise a comparison function circuit 18, a template memory function circuit 20 and a display function circuit 22 coupled to a trace hard copy function device 24.

In FIG. 4, the above-discussed functions have function couplings 15, 17, 19, 21 and 23. The function sequences comprise: analog-to-digital conversion, sample memory storage, compare to template memory, display in bar graph form, and output to hard copy.

In FIG. 4 also, the above-identified functions have been indicated in block diagram form. The corresponding electronic circuits to perform the functions individually are not in themselves the subject of this present patent application and circuits and apparatus capable of performing these individual functions will be matters of routine design work for a person of technical competence in this field.

ADC circuit 14 provides a known analog-to-digital function. The circuit provides two analog input channels, each with an input multiplexer for user signal selection. The input signal on each channel is amplified by a programmable gain amplifier, and an offset is introduced if necessary.

The resultant amplified input signal on each channel is processed by ADC 14. The sampling rate of the analog-to-digital conversion step is fixed at a rate dependent upon the maximum signal frequency specified on that channel. Accordingly, the analog-to-digital conversion is carried out at a reasonable maximum sampling rate in order to achieve, at all signal frequencies suitable for the apparatus 10, a sufficient number of data samples per waveform for the analytical steps which follow.

The digitized signal data from ADC circuit 14 is transmitted to sample memory 16 and stored. The memory function provided by circuit 16 has capacity sufficient to store data from both input channels such that, at the lowest input signal frequency sufficient data is captured to represent (in the case of internal combustion engine analysis) one complete engine cycle.

As shown at 21, sample memory 16 is coupled to display 22 to enable a bar graph representation of the digitized input signal to be displayed and, if necessary, traced as a hard copy by device 24.

Template memory function circuit 20 performs a similar function to sample memory circuit 16, having stored therein, in digitized form, sample "standard" template or comparison signals to be used as a comparison basis. These template signals can be selectively transmitted to comparison function circuit 18 for comparison with corresponding input signals derived from sample memory 16.

The signal comparison function circuit 18 thus receives signals to be compared from sample memory 16 and template memory 20. The comparison function is carried out on a point-by-point or sample-by-sample basis, whereby deviations are identified likewise on the same basis. Circuit 18 produces an output through signal line 23 to bar graph display 22 whereby the result of the comparison steps can be displayed in bar graph form. Such display will now be discussed with reference to FIGS. 5 and 6.

Figure 6:
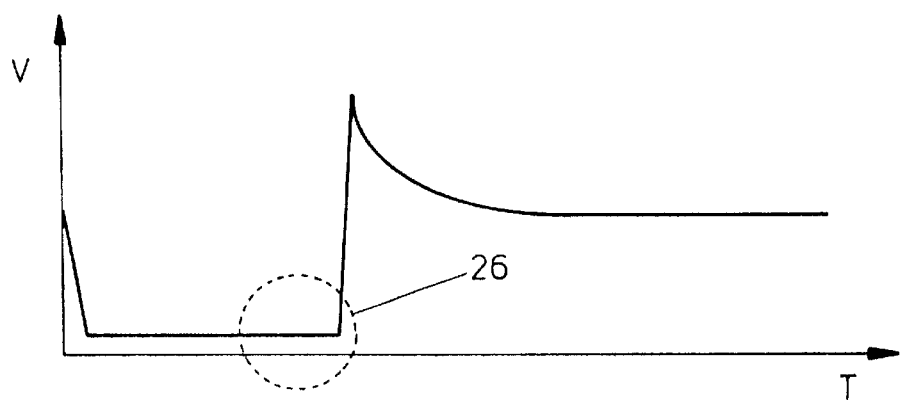

Comparison of FIGS. 5 and 6 shows, in this illustrative simple example, a deviation between the two signals at the location identified at 26 where the injector has a fault in terms of excess hold time.

In an analog display system in accordance with prior art teachings, it would be necessary for the user to identify area 26 merely from visual inspection of the analog trace seen in FIG. 6. Such identification would depend upon the user having clear recall of, (or the opportunity for cross-reference to) the standard trace shown in FIG. 5.

Figure 7:
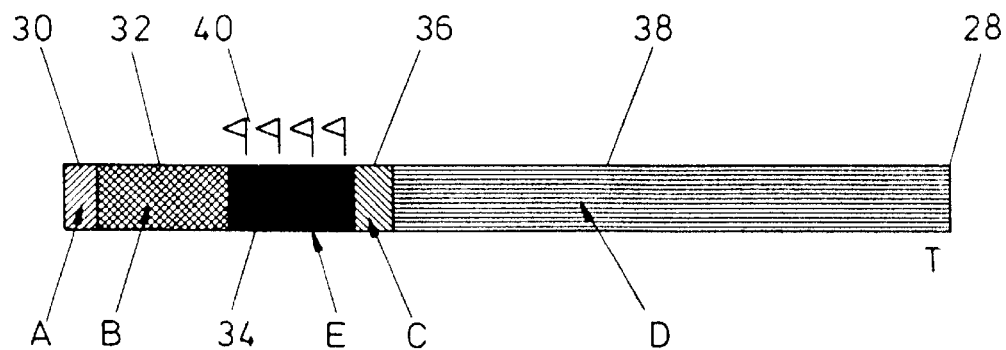
FIG. 7 shows in bar-graph form the result of the analysis of the signals of FIGS. 5 and 6 by the apparatus of FIG. 4, and showing in the darkened portion 34 of the bar graph, and highlighted by signals 40, the error portion (E) of the injector function.

In accordance with the method and apparatus of the present invention, the result of the comparison steps carried out by circuit 18 is produced in the bar graph form 28 shown in FIG. 7.

As shown in FIG. 7, bar graph 28 includes portions 30, 32, 34, 36 and 38 corresponding respectively to opening (A), and held-open (B), and fault indication (E), and closing (C), and held-closed (D) portions of the operating function of the injector.

The divergence between the digitized signals of FIGS. 5 and 6 at location 26 has resulted in the production of error indication portion 34 in bar graph 28, whereby the presence of such an error is instantly indicated. This is emphasized by the highlighting signals 40 which are simultaneously displayed.

As discussed above, bar graph 28 represents only one way of reproducing the result of the comparison function of apparatus 10, and other modes will be apparent to those skilled in the art on the basis of the above disclosure.

The trace hard copy device 24 enables the production of hard copies in the usual way for reference purposes.

Turning now to the examples of FIGS. 8 to 17, these figures show wave forms and corresponding bar graphs illustrative of the use of the method and apparatus of the invention for detecting and identifying differences in phase between input and template signals.

Figure 8:
Figure 9:
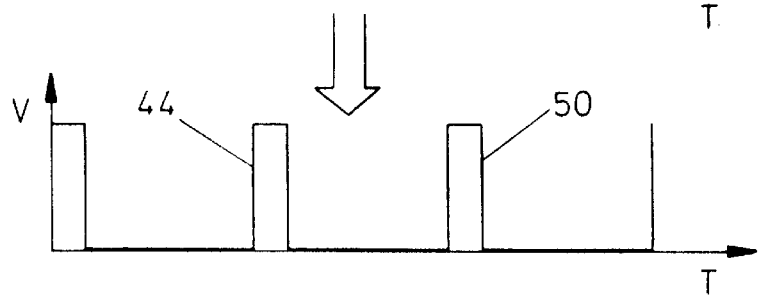
Figure 10:
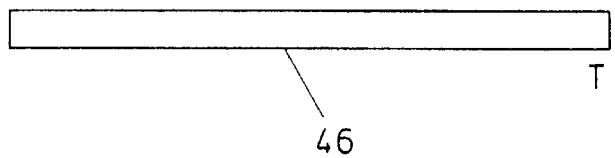

Thus, in FIGS. 8 and 9, the template signal of FIG. 8 is disposed in relation to the input signal of FIG. 9 so that the trailing edges 42, 44 of the respective wave forms are disposed in phase. Accordingly, the apparatus is arranged to show in the resultant bar graph 46 a uniformity of output which is indicative of no error-detection step, and thus the bar graph of FIG. 10 indicates the in-phase relationship of the above-discussed portions of the two wave forms.

Figure 11:
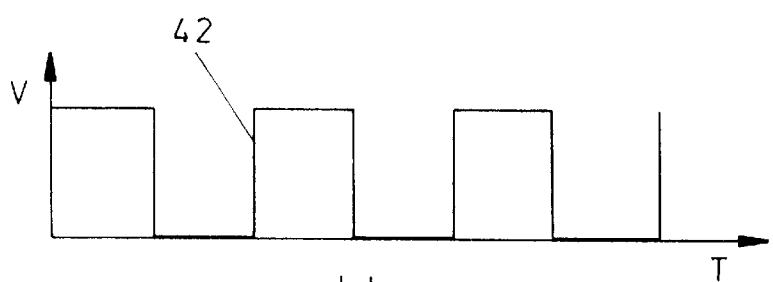
Figure 12:
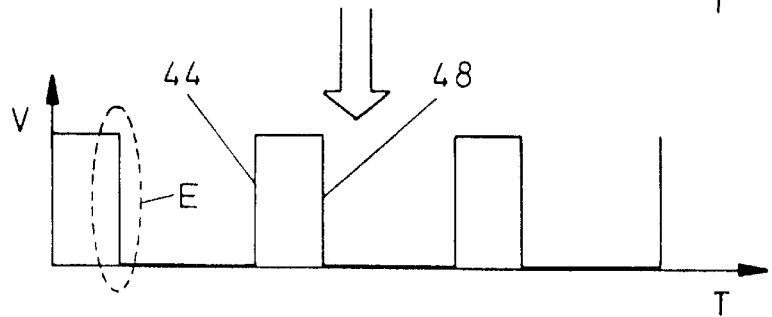

In the wave forms of FIGS. 11 and 12, the template wave form of FIG. 11 corresponds to that of FIG. 8, and the leading edges of the input signal and of the template are likewise disposed in phase and are identified by reference numerals 44 and 42, as in the preceding example. However, the trailing edge 48 of the input wave form is disposed (see FIG. 12) out of phase with respect to the corresponding trailing edge 50 of the input wave form of FIG. 9. Accordingly, a corresponding "error" (E) is identified at 52 and flagged by signals 53 in the bar graph 54 of FIG. 13.

Figure 13:
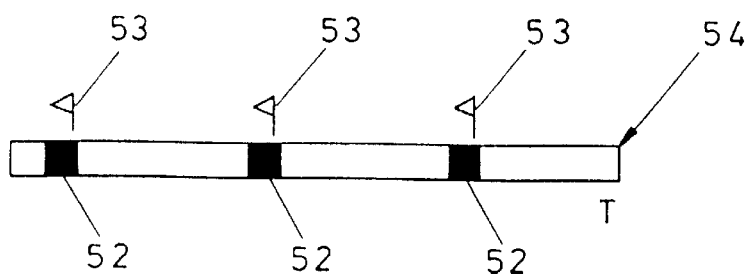

It can thus be seen that the comparison functions illustrated in FIGS. 8 to 13 represent uses of the method and apparatus of the invention for the detection and identification of phase differences, not only between one input wave form and a corresponding template (FIGS. 8–10), but between such an input wave form and two or more wave forms used as a comparison basis (FIGS. 11–13).

In the embodiment of FIGS. 14 to 17, the trigger signal 60 of FIG. 14 is employed to co-ordinate the in-phase relationship therewith of template waveform 62 in FIG. 15, whereby the phase-shift 64 between template 62 and input waveform 66 (being a median of a number of sampled input signals) is identified on bar graph 68 of FIG. 17 as error signals 70, flagged at 72.

In this embodiment, the trigger signal 60 provides the phase coordination basis for the phase comparison function of the method and apparatus.

It will be appreciated that suitable software may be provided which can provide, for example, a detailed statement of the remedial action required, which has been deduced from the comparison step by the data processing apparatus. Alternatively, the indication of compliance may provide (in the case of non-compliance) a graphical representation or diagram indicating the remedial action required, e.g. a diagram of an injector pin requiring attention. Such remedial action indications can be displayed on the display 22.

According to a further aspect of the invention it is envisaged that the template forming the basis for comparison with the digitized data from the input signal will be available in adaptive form, whereby this basis for comparison is adaptable selectively to take account of, for example, progressive input signal changes recorded at time intervals and enabling corresponding time interval based analysis to be performed.

For implementation of the above-mentioned adaptive template, there may be provided a template adaptation circuit 25 coupled between the sample memory 16 and the template memory 20. It is envisaged that the circuits 25 will embody neural networks (known per se) constructed to provide the facility for memorizing or "learning" the waveform or waveforms to be used as a basis for comparison. Reference is directed to "Machine Design" (v 65 n21 pages 133/134 of Oct. 22, 1993) by Patton, Alton; Swann, David and Arikara, Murali on the use of neural networks in Design (copyright Penton Publishing 1993). See also Electronic Design (v43, n9 page 38) by Ajluni, Cheryl on neural network/fuzzy—logic technology in which fuzzy logic is used to tune the neural networks (copyright 1995 Penton Publishing Inc).

In still further embodiments, the basis for comparison between the template data and the incoming data may be alternative parameters of the respective waveforms, including not only waveform and amplitude and frequency, and phase relationship, but also other variables including average values of particular ones of these parameters. Moreover, the comparison may be based on more than one waveform simultaneously sampled and compared. In the case of phase relationship, the analysis may be on the basis of a comparison between a particular chosen part of a waveform, for example a leading or trailing edge of a square wave.

Whereas in the embodiments described above, there is employed a single waveform or signal in which a single function is plotted against time, it is envisaged that a chosen parameter need not be necessarily considered in relation to time, and the functions to be cross-related include not only time but also amplitude, frequency and phase. Moreover, multiple signals or waveforms may be simultaneously analyzed in accordance with the method and apparatus of the invention.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for analysis of engines and/or other rotary machines comprising:
   a) input means to provide an input signal related to an available characteristic of the operation of a rotary machine;
   b) signal value comparison means coupled to said input means to effect electronic comparison of said input signal with a corresponding template signal; and
   c) means to adapt the template signal in accordance with progressive changes in the input signal.

2. Apparatus for analysis of engines and/or other rotary machines comprising:
   a) input means to provide an input signal related to available characteristic of the operation of a rotary machine;
   b) signal value comparison means adapted to effect electronic comparison of the input signal with a corresponding template signal; and
   c) indicator means to generate an indication of compliance or divergence of the input and template signals, said indicator means including bar graph generation means to display the degree of compliance or divergence in bar graph form.

3. Apparatus for analysis of engines and/or other rotary machines comprising:
   a) input means to obtain an analog input signal related to a variable characteristic of the operation of a rotary machine;
   b) analog-to-digital conversion means coupled to said input means for converting the analog input signal to a digitized input signal;
   c) signal analysis means coupled to said conversion means to analyze said digitized input signal to determine information relating to the variable characteristic;
   d) said analysis means including signal comparison means adapted to effect electronic comparison of a digitized input signal with a corresponding prestored digitized template signal; and
   e) indicator means adapted to generate an indication of compliance or divergence of the input and template signals.

4. Apparatus according to claim 3, and further comprising signal storage and retrieval means adapted to store and retrieve signals for use as the template signal.

5. Apparatus according to claim 4, wherein said signal storage and retrieval means includes means to adapt the template signal in accordance with progressive changes in the digitized input signal as a basis for comparison.

6. Apparatus according to claim 4, wherein said signal storage and retrieval means includes means to store and retrieve at least two digitized template signals as a basis for comparison.

7. Apparatus according to claim 4, wherein said signal comparison means includes means adapted to effect comparison of said digitized signals on the basis of at least one of the parameters of the input signal waveform selected from the group consisting of:
   a) signal waveform shape;
   b) signal amplitude;
   c) signal frequency;
   d) signal phase;
   e) signal phase of a chosen part of the input waveform.

8. Apparatus according to claim 4, adapted for analysis of internal combustion engines, wherein said input means includes means to provide a signal from a signal source selected from the group consisting of:
   a) spark ignition system signals;
   b) electronic control unit signals;
   c) transducer-generated vibration signals;
   d) transducer-generated gas pressure sensing signals;
   e) shaft encoder signals
   f) alternator ripple signals.
   g) transducer-generated acoustic signals;
   h) battery signals.

9. Apparatus according to claim 3, wherein said signal comparison means includes means adapted to compare the digitized signals on a sample-by-sample basis.

10. Apparatus according to claim 3, wherein said indicator means includes means to (in the case of divergence) indicate corresponding remedial action.

11. Apparatus according to claim 3, wherein said signal comparison means includes means to compare averaged values of at least one parameter of the digitized input signal with corresponding averaged values of the digitized template signal.

12. Apparatus according to claim 3, wherein said conversion means has a fixed sampling rate related to the maximum frequency of the analog input signal, such that a sufficient plurality of data samples per waveform are obtained at said maximum frequency for the purpose of comparison of the digitized input and template signals.

13. Apparatus according to claim 3, wherein said indicator means includes bar graph display means to indicate the degree of compliance or divergence.

14. Apparatus according to claim 3, and further comprising trigger signal generation means adapted to generate a trigger signal for use in establishing a phase-coordinated relationship between the digitized input and template signals.

15. A method of analysis of engines and other rotary machines comprising: comparing an input signal related to a variable characteristic of the operation of a rotary machine with a corresponding template signal, and progressively adapting the template signal in accordance with progressive changes in the input signal.

16. A method of analysis of engines and other rotary machines comprising: providing an input signal related to a variable characteristic of the operation of a rotary machine, comparing the input signal with a corresponding template signal, and generating an indication of compliance or divergence of said signals, said compliance or divergence being indicated in bar graph form.

17. A method of analysis of engines and/or other rotary machines comprising:
   a) providing an analog input signal related to a variable characteristic of the operation of a rotary machine;
   b) digitizing the analog input signal to provide a digitized input signal;
   c) electronically comparing the digitized input signal with a corresponding pre-stored digitized template signal;
   d) determining the degree of compliance or divergence between the digitized input signal and the digitized template signal; and
   e) generating an indication of compliance or divergence of said signals.

18. A method according to claim 17, wherein the step of comparing includes comparing the digitized signals on a sample-by-sample basis, and the step of generating an indication includes indicating accordingly for samples individually or in groups.

19. A method according to claim 17, wherein the step of comparing includes comparing averaged values of at least one parameter of the digitized input signal with corresponding averaged values of the digitized template signal.

20. A method according to claim 17, and further comprising the step of indicating the divergence (if any) by providing an indication of appropriate remedial action.

21. A method according to claim 17, and further comprising the step of progressively adapting the digitized template signal in accordance with progressive changes in the digitized input signal.

22. A method according to claim 17, wherein the step of comparing includes comparing on the basis of at least one parameter of the input signal selected from the group consisting of: signal waveform shape, signal amplitude, signal frequency, signal phase, and signal phase of a chosen part of the input waveform.

23. A method according to claim 17, wherein the digitizing step includes analog-to-digital conversion of the analog input signal at a fixed sampling rate related to the maximum frequency of the analog input signal such that a sufficient plurality of data samples per waveform are obtained at said maximum frequency for effecting the comparison step.

24. A method according to claim 17, wherein the step of generating an indication includes displaying the degree of compliance or divergence in bar graph form.

25. A method according to claim 17, and further comprising the step of establishing a phase-coordinated relationship between the digitized input and template signals by means of a trigger signal.

26. A method according to claim 17, wherein the step of comparing includes employing at least two digitized template signals as a basis for comparison.

27. A method according to claim 17, adapted for the analysis of internal combustion engines, wherein the step of providing the input signal includes providing said signal from a signal source selected from the group consisting of:
   a) spark ignition system signals;
   b) electronic control unit signals;
   c) transducer-generated vibration signals;
   d) transducer-generated gas pressure sensing signals;
   e) shaft encoder signals;
   f) alternator ripple signals;
   g) transducer-generated acoustics signals;
   h) battery signals.

* * * * *